United States Patent
de Swiet et al.

(10) Patent No.: US 6,593,743 B2
(45) Date of Patent: Jul. 15, 2003

(54) ROUNDED-CONDUCTOR NMR RF RESONATORS

(75) Inventors: Thomas de Swiet, Redwood City, CA (US); Marco A. Romo, Castro Valley, CA (US); Nancy Winward, Milpitas, CA (US)

(73) Assignee: Varian, Inc., Palo Alto, CA (US)

( * ) Notice: Subject to any disclaimer, the term of this patent is extended or adjusted under 35 U.S.C. 154(b) by 48 days.

(21) Appl. No.: 10/035,299

(22) Filed: Oct. 26, 2001

(65) Prior Publication Data

US 2003/0080740 A1 May 1, 2003

(51) Int. Cl.[7] ................................................. G01V 3/00
(52) U.S. Cl. ........................ 324/318; 324/309; 324/322
(58) Field of Search ................................ 324/318, 319, 324/322, 309, 307, 300

(56) References Cited

U.S. PATENT DOCUMENTS

| | | | |
|---|---|---|---|
| 3,091,732 A | 5/1963 | Anderson et al. | |
| 4,388,601 A | 6/1983 | Sneed, Jr. et al. | 333/227 |
| 4,398,149 A | 8/1983 | Zens | 324/319 |
| 4,517,516 A | 5/1985 | Hill et al. | 324/318 |
| 4,641,098 A | 2/1987 | Doty | 324/322 |
| 4,680,548 A | 7/1987 | Edelstein et al. | 324/318 |
| 4,692,705 A | 9/1987 | Hayes | 324/318 |
| 4,840,700 A | 6/1989 | Edelstein et al. | 156/634 |
| 4,878,022 A | 10/1989 | Carlson | 324/318 |
| 5,192,911 A | 3/1993 | Hill et al. | 324/322 |
| 5,818,232 A | 10/1998 | Mehr et al. | 324/318 |
| 6,054,855 A | 4/2000 | Anderson | 324/318 |
| 6,201,392 B1 | 3/2001 | Anderson et al. | 324/300 |
| 6,236,206 B1 | 5/2001 | Hartman et al. | 324/318 |
| 6,252,403 B1 * | 6/2001 | Alsop | 324/318 |
| 6,285,189 B1 | 9/2001 | Wong | 324/318 |
| 6,369,570 B1 * | 4/2002 | Wong et al. | 324/318 |
| 6,420,871 B1 * | 7/2002 | Wong et al. | 324/318 |

FOREIGN PATENT DOCUMENTS

EP          0 856 744 A1          8/1998

OTHER PUBLICATIONS

Article by Crockcroft, J.D., entitled "Skin Effect In Rectangular Conductors at High Frequencies", published by Proceeding of the Royal Society of London, Series A, vol. 122, pp. 533–542, Feb. 1929.

* cited by examiner

Primary Examiner—Diego Gutierrez
Assistant Examiner—Brij B. Shrivastav
(74) Attorney, Agent, or Firm—Andrei Popovici; Bella Fishman

(57) ABSTRACT

A radio-frequency (RF) coil for a nuclear magnetic resonance (NMR) probe includes rounded longitudinal conductors connecting end rings formed by sheets. The rounded conductors can be formed by curled sheets or wires. The rounded conductors allow reduced RF losses at the coil window edges, and thus allow increased coil sensitivities. The rounded conductors also allow increased coil sensitivities for an orthogonal coil, by allowing increased transparency to the magnetic field generated by the orthogonal coil. A curled-sheet RF coil can be generated from a single etched sheet by curling longitudinal sections of the sheet into tubular longitudinal conductors. To make such a coil, each longitudinal section is inserted into a longitudinal slot of a sheet-curling member, and the member is rotated about its longitudinal axis. As the curling member is rotated, the longitudinal sheet section wraps around the curling member and becomes curled. The curling member can be provided as part of a sheet-curling tool including two transverse plates for securing the coil into place between the plates, and a set of guides allowing the longitudinal motion of one plate relative to the other.

41 Claims, 9 Drawing Sheets

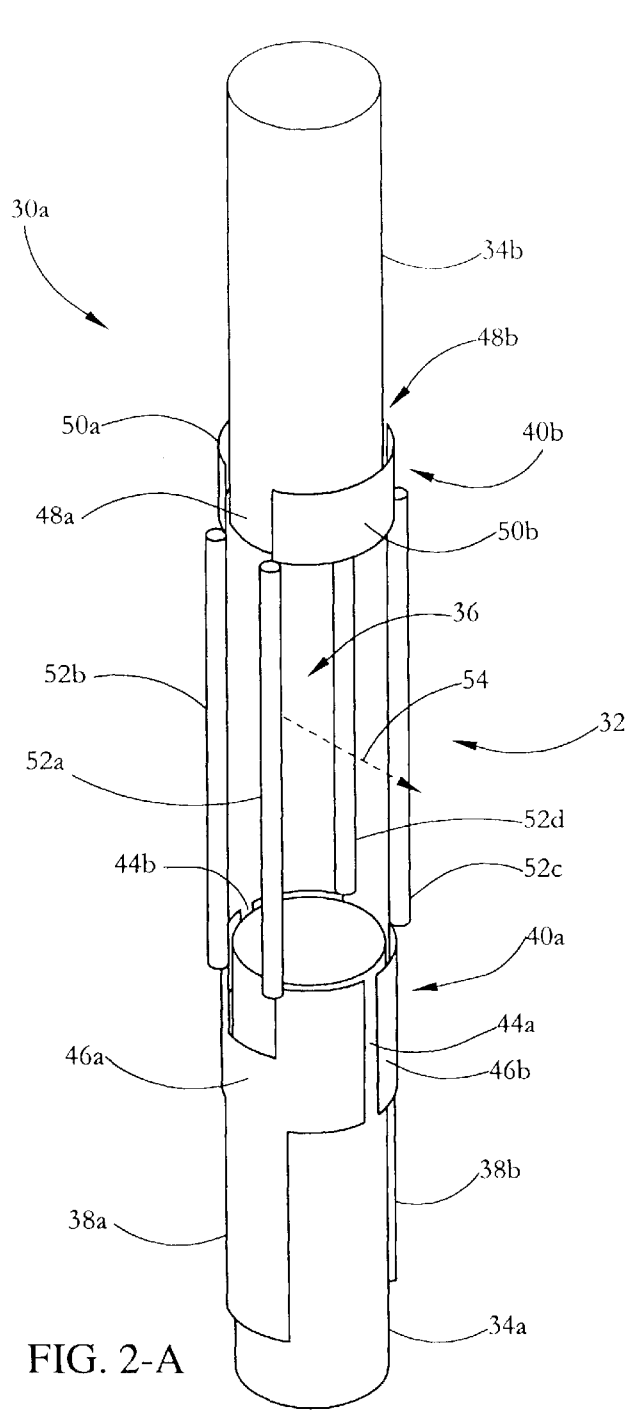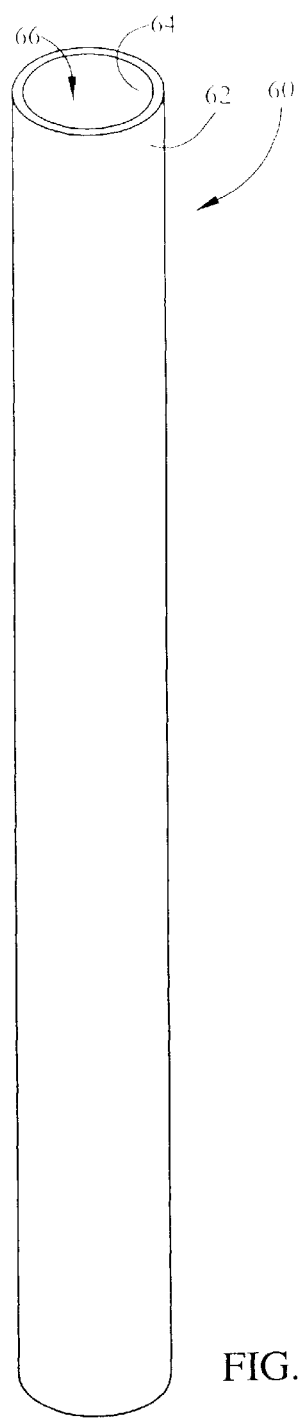
FIG. 2-A
FIG. 2-B

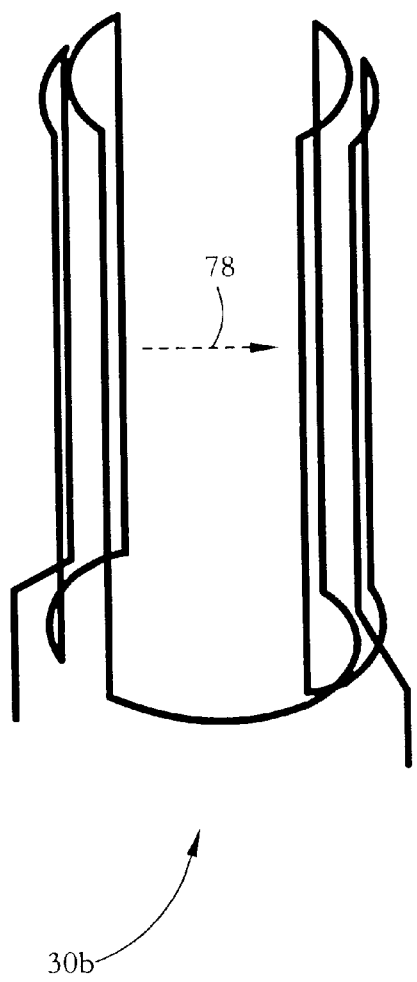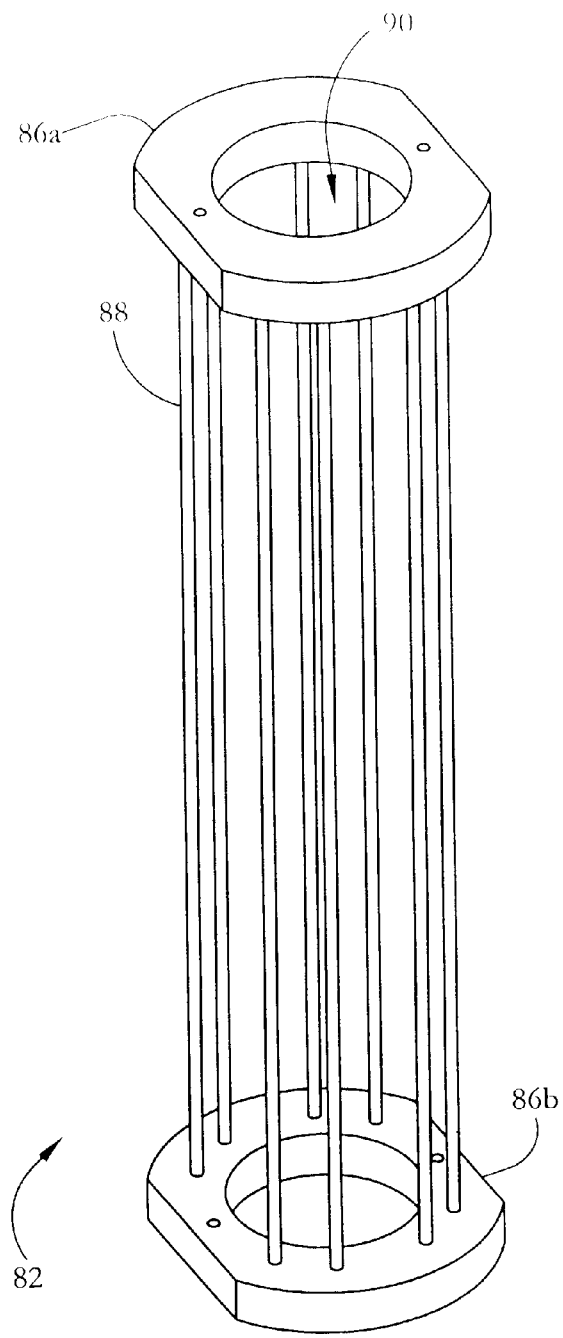
FIG. 3-A          FIG. 3-B

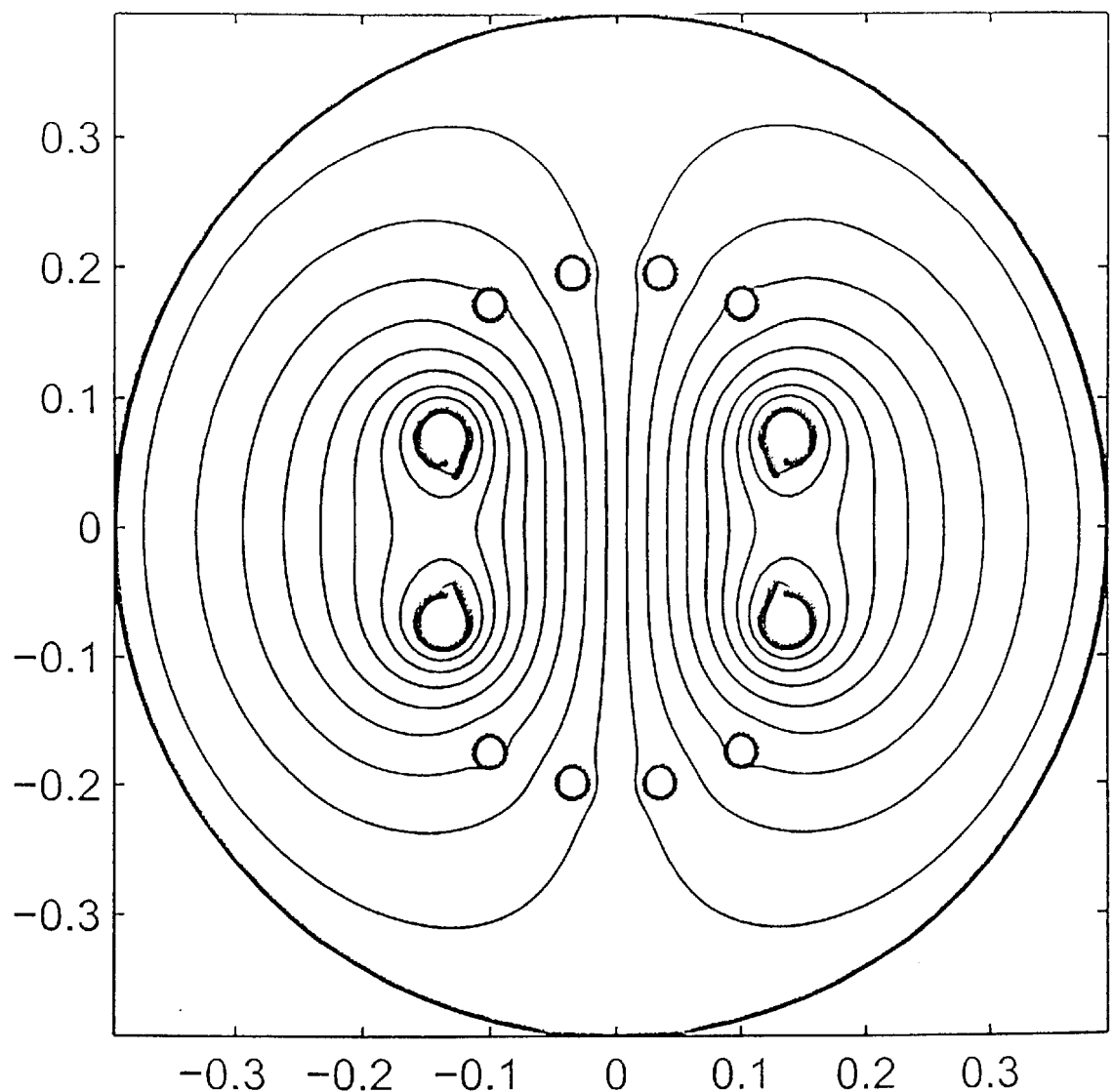
FIG. 4-A

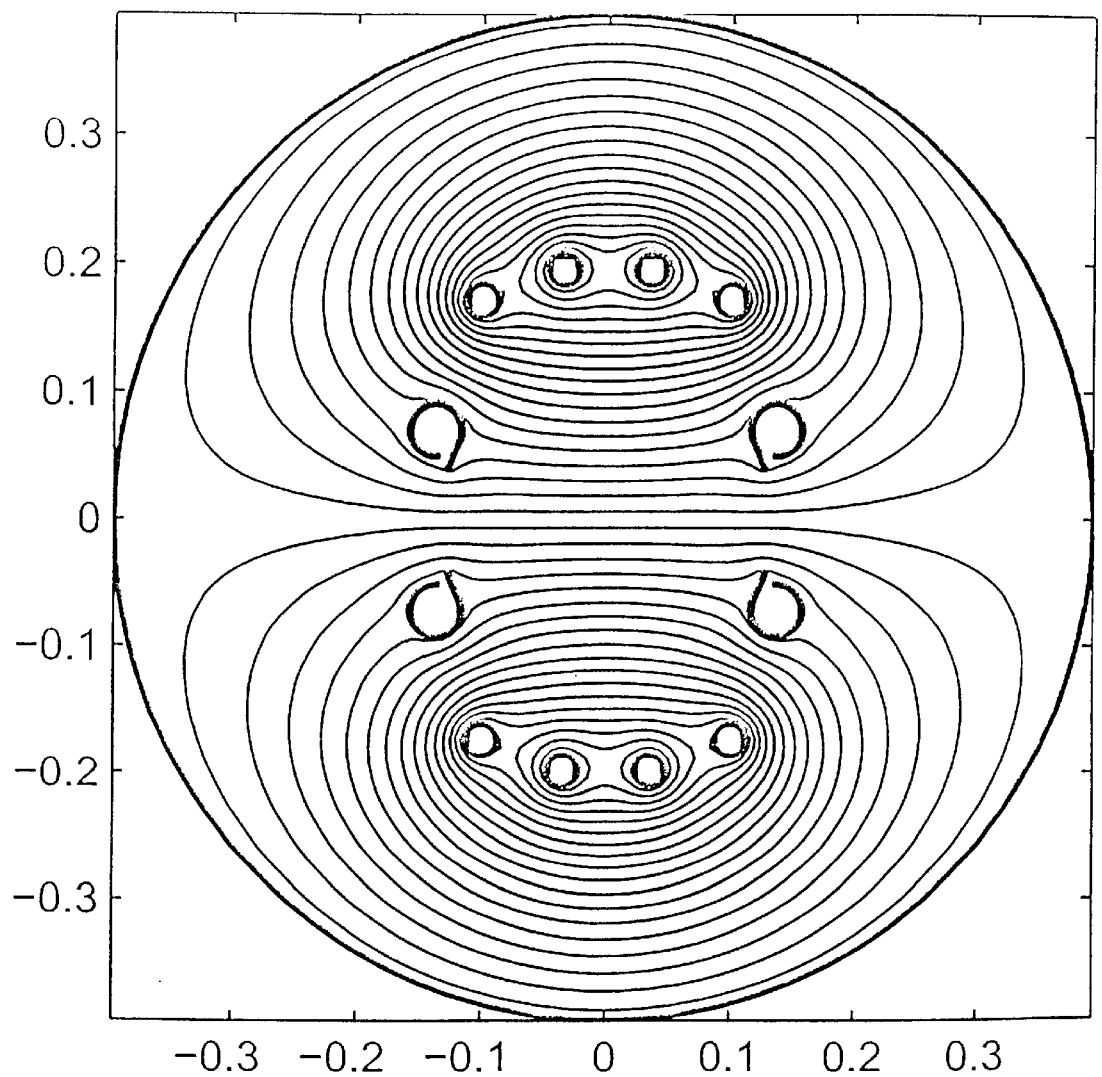
FIG. 4-B

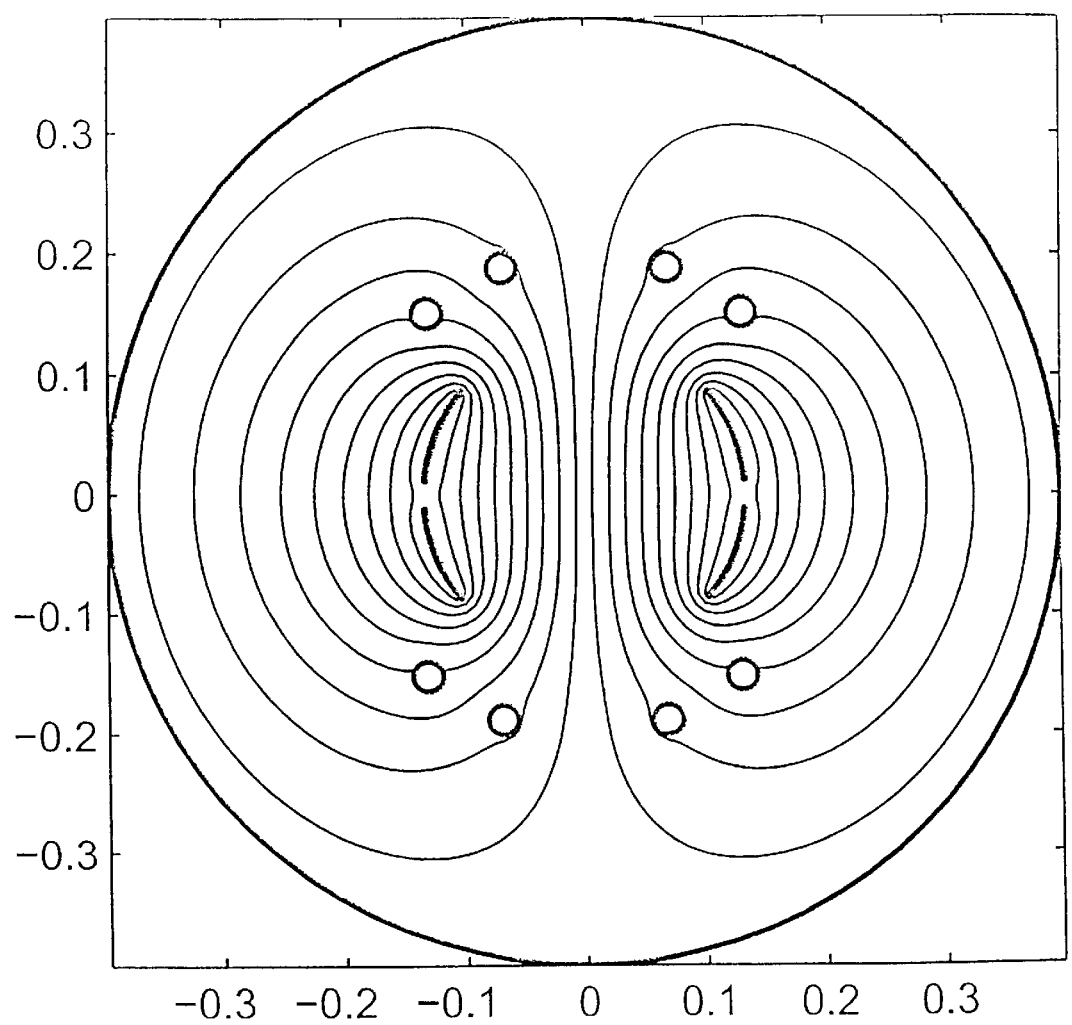
FIG. 4-C
PRIOR ART

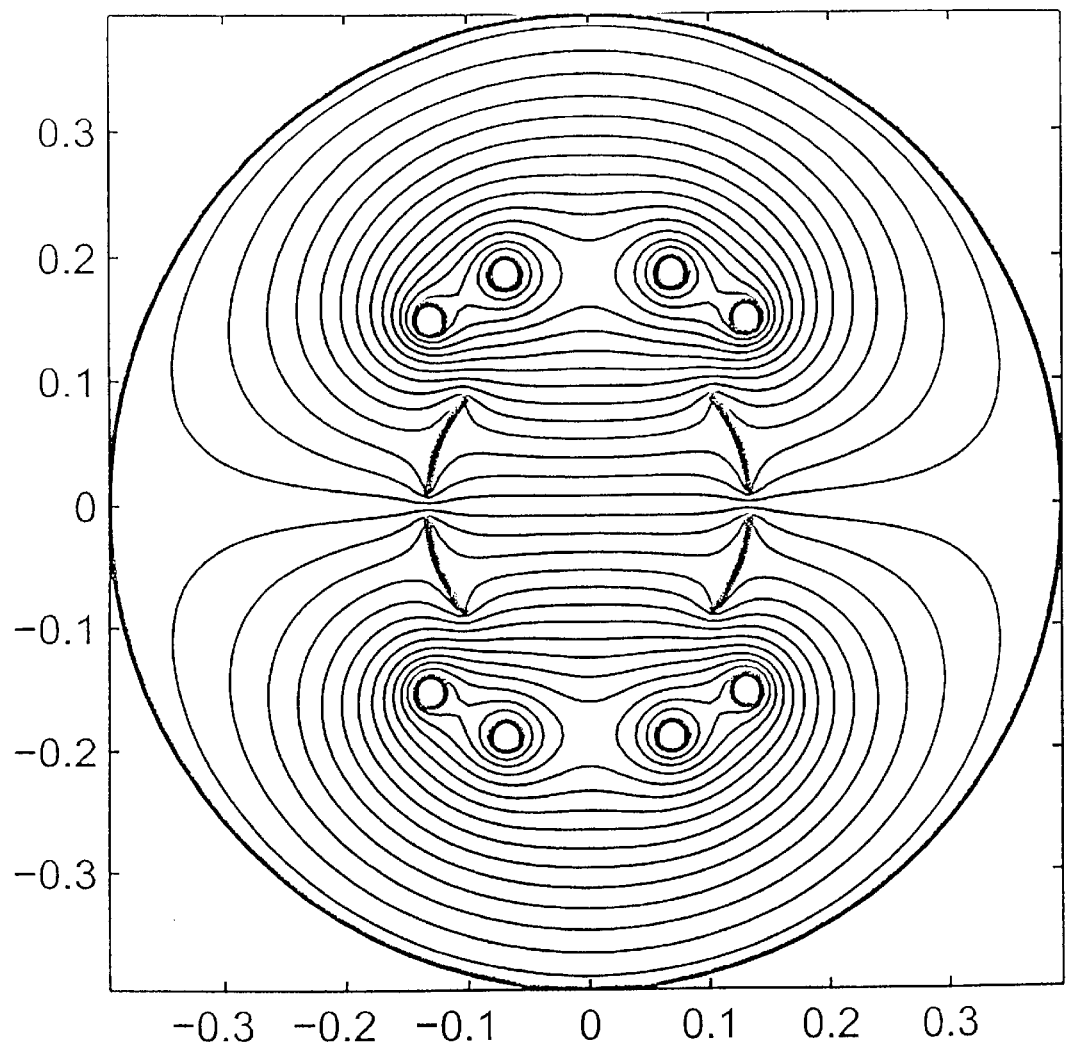
FIG. 4-D
PRIOR ART

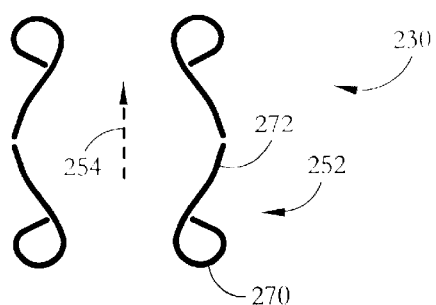
FIG. 6
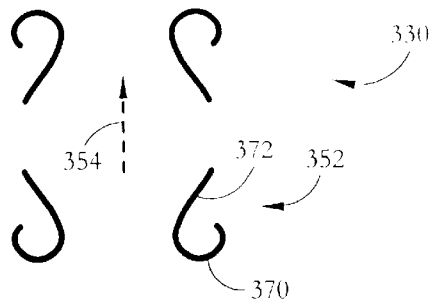
FIG. 7
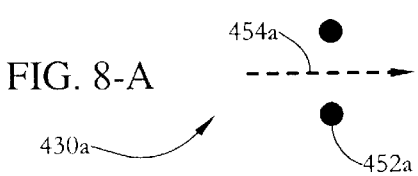
FIG. 8-A
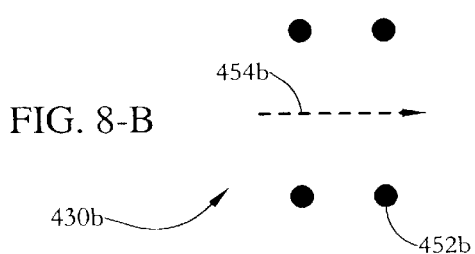
FIG. 8-B
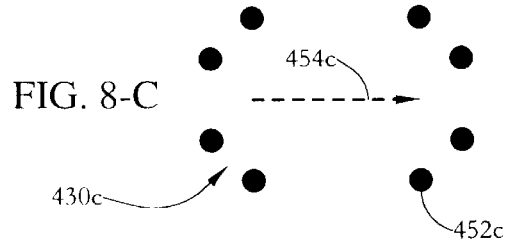
FIG. 8-C
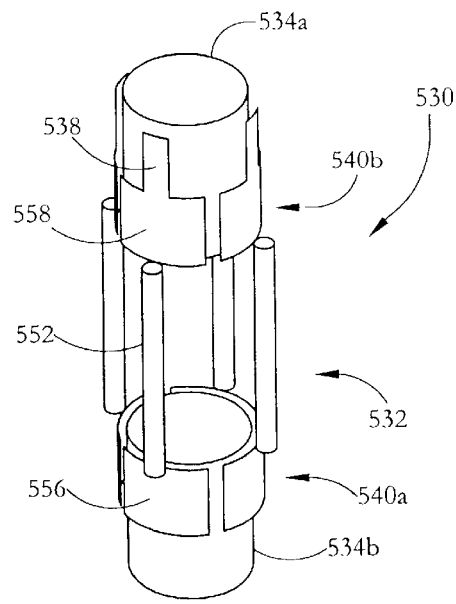
FIG. 9

ROUNDED-CONDUCTOR NMR RF RESONATORS

FIELD OF THE INVENTION

The invention in general relates to nuclear magnetic resonance (NMR), and in particular to radio-frequency (RF) coils and coil assemblies for NMR.

BACKGROUND OF THE INVENTION

Nuclear magnetic resonance (NMR) spectrometers typically include a superconducting magnet for generating a static magnetic field $B_0$, and one or more special-purpose radio-frequency (RF) coils for generating a time-varying magnetic field $B_1$ perpendicular to the field $B_0$, and for detecting the response of a sample to the applied magnetic fields. Each RF coil can resonate at the Larmor frequency of a nucleus of interest present in the sample. The RF coils are typically provided as part of an NMR probe, and are used to analyze samples situated in test tubes or flow cells. The direction of the static magnetic field $B_0$ is commonly denoted as the z-axis, while the plane perpendicular to the z-axis is commonly termed the x-y or $\theta$-plane. In the following discussion, the term "longitudinal" will be normally used to refer to the z-direction, while the term "transverse" will be used to refer to the $\theta$-direction.

Conventional RF coils used for NMR include helical coils, saddle coils, resonant cavities, and birdcage resonators. For information on birdcage resonators see for example U.S. Pat. Nos. 4,692,705, 6,236,206, and 6,285,189. For information on saddle-shaped and other coils see for example U.S. Pat. Nos. 4,398,149, 4,388,601, 4,517,516, 4,641,098, 4,840,700, 5,192,911, 5,818,232, and 6,201,392.

The measurement sensitivity that can be achieved with an NMR coil increases with the coil quality factor Q and its filling factor n. The quality factor Q can be maximized by reducing coil losses. The filling factor n can be increased by reducing the coil size relative to the sample. At the same time, reducing the coil size relative to the sample can increase magnetic field inhomogeneities. Inhomogeneities in the RF magnetic field adversely affect the measurement sensitivity. Moreover, the coil design and dimensions are constrained by the requirement that the coil resonate in a desired frequency range. The resonant frequency of interest is determined by the nucleus of interest and the strength of the applied static magnetic field $B_0$.

The conducting parts of conventional coils are typically formed by wires having a round cross-section, or by conductive patterns formed from a thin sheet. Coils formed from sheets can have relatively high distributed capacitances, and thus relatively low inductances, for given coil sizes and resonant frequencies. The measurement sensitivities achievable with typical sheet-conductor coils can be limited by coil losses.

An NMR probe can include multiple NMR coils, each tuned for performing NMR measurements on a different nucleus of interest. For example, an NMR probe can include one coil for performing NMR measurements on protons, and another coil for performing NMR measurements on other nuclei of interest, such as $^{13}C$ or $^{15}N$. In such an NMR probe, the design of one coil can affect the performance of the other coil(s). In order to reduce the coupling between two coils, the coils can be disposed in a quadrature configuration, so that the magnetic fields generated by the coils are mutually orthogonal. This configuration minimizes the mutual inductance between the coils.

The uniformity of the static and RF magnetic fields can be improved by employing susceptibility-compensated wires or sheets for the coil conductors. Abrupt changes in magnetic susceptibility near the sample can significantly degrade the field uniformity in the sample region. A susceptibility-compensated coil has an effective magnetic susceptibility roughly equal to that of the coil environment, which is commonly air or vacuum. A susceptibility-compensated sheet coil can be formed from a sandwich of two or more layers, wherein the materials and thicknesses of the layers are chosen to generate a desired effective susceptibility for the coil. For example, a paramagnetic layer and a diamagnetic layer can be stacked together to yield an effective susceptibility much lower in absolute value than the susceptibility of either layer alone. Effectively achieving susceptibility compensation can constrain RF coil thicknesses. For example, a relatively thin sheet may be required for achieving an effective coil susceptibility approaching zero. For further information on susceptibility-compensated NMR coils see for example U.S. Pat. Nos. 3,091,732 and 6,054,855.

As is apparent from the above discussion, the design of RF coils for NMR applications is highly constrained by multiple parameters. Maximizing the measurement sensitivity of an RF coil or coil assembly typically involves a balancing of effects of various design parameters. Coil designs providing increased design flexibility to the system designer would allow building NMR systems with increased sensitivities.

SUMMARY OF THE INVENTION

The present invention provides radio-frequency coils and coil assemblies allowing reduced RF losses, improved NMR measurement sensitivities, and improved magnetic field homogeneities. A radio-frequency coil for an NMR probe and spectrometer includes a plurality of rounded-edge longitudinal conductors interconnecting a pair of longitudinally-spaced, generally transverse ring-shaped sheet conductors. In the presently preferred embodiment, each rounded-edge longitudinal conductors is formed by a generally-longitudinal curled sheet including a tubular or cylindrical portion. The curled sheet and the transverse ring-shaped conductors can be formed from a single susceptibility-compensated sheet. In another embodiment, each longitudinal conductor is formed by a tubular solid wire. The RF coil can be a birdcage coil or a saddle-shaped coil. The rounded-edge sheet coil can be provided as part of a coil assembly including an additional radio-frequency coil disposed orthogonally and concentrically with respect to the rounded-edge coil.

The transverse sheet conductors provide for relatively large distributed capacitances, while the rounded longitudinal conductors allow reducing coil losses and provide for increased transparency to orthogonal magnetic fields. Rounding the coil edges around the coil windows allows reducing the concentration of RF current at the coil edges, and thus reducing the RF losses within the coil. The reduced RF losses allow improved measurement sensitivities. The rounded shapes of the longitudinal conductors also allows increasing the transparency of the longitudinal conductors to the magnetic field generated by the additional, orthogonal coil.

A sheet-curling tool comprising a rotatable, slotted longitudinal curling member simplifies the manufacture of a rounded-conductor coil from a single sheet. The curling member has a longitudinal slot extending along the member, for retaining a sheet conductor to be curled. The slot terminates in a distal open end at a longitudinal end of the curling member. The distal open end allows inserting and removing the sheet conductor longitudinally into/from the curling member. The curling member is mounted on a support comprising two longitudinally-spaced, generally transverse parallel plates. A pair of longitudinal guides is mounted on one of the plates. The longitudinal guides pass through corresponding apertures in the other plate, and allow the two plates to slide longitudinally to grip a patterned sheet in place between the plates. Once the sheet is secured, a wing of the patterned sheet is inserted into the longitudinal slot of the curling member, and the curling member is rotated about its longitudinal axis to curl the wing into a cylinder.

BRIEF DESCRIPTION OF THE DRAWINGS

The foregoing aspects and advantages of the present invention will become better understood upon reading the following detailed description and upon reference to the drawings where:

FIG. 2-A shows an isometric view of a conductive part of a rounded-conductor RF coil according to the present invention.

FIG. 2-B shows an isometric view of a dielectric support for supporting the conductive part of FIG. 2-A, according to the present invention.

FIG. 3-A shows an isometric view of a saddle-shaped conductive part of a coil, suitable for use in conjunction with the coil illustrated in FIG. 2-A, according to the present invention.

FIG. 3-B shows an isometric view of a support for supporting the conductive part of FIG. 3-A, according to the present invention.

FIGS. 4-A and 4-B show central transverse views of a coil assembly including an inner coil such as the one shown in FIG. 2-A, and computed magnetic fields generated by the inner and outer coil, respectively, according to the present invention.

FIGS. 4-C and 4-D show central transverse views of a coil assembly including a prior art flat (non-curly) sheet inner coil and a prior art outer wire coil, and computed magnetic fields generated by the inner and outer coil, respectively.

FIG. 6 shows a central transverse sectional view of the center of another rounded-conductor RF coil according to the present invention.

FIG. 7 shows a central transverse sectional view of the center of yet another rounded-conductor RF coil according to the present invention.

FIGS. 8-A through 8-C show central transverse sectional views of still other rounded-conductor RF coils according to the present invention.

FIG. 9 shows an isometric view of an exemplary rounded-conductor birdcage coil according to the present invention.

DETAILED DESCRIPTION OF THE INVENTION

In the following description, it is understood that each recited element or structure can be formed by or be part of a monolithic structure, or be formed from multiple distinct structures. A "curled" or "rounded" conductor is understood to include at least a part having a radius of curvature smaller than the overall radius of curvature of the coil to which the conductor belongs. A curled or rounded sheet is understood to have a curling or rounding radius of curvature larger than the thickness of the sheet. The statement that a coil is mechanically coupled to a sample holder is understood to mean that the coil is held in fixed relation to the sample holder. Such a coil may be indirectly coupled to the target holder through intermediate support structures. The statement that a first coil is positioned orthogonally with respect to a second coil is understood to mean that the magnetic fields generated by the first and second coils are substantially orthogonal. The statement that a first coil is positioned concentrically with respect to the second coil is understood to mean that the two coils have substantially coincident longitudinal axes. The term "ring" is understood to encompass slotted (discontinuous) rings, and rings having non-circular transverse cross-sections. The term "tube" is understood to encompass solid tubes (e.g. tubes formed by wires) and hollow tubes (e.g. tubes formed by curled sheets).

The following description illustrates embodiments of the invention by way of example and not necessarily by way of limitation.

Figure 1:
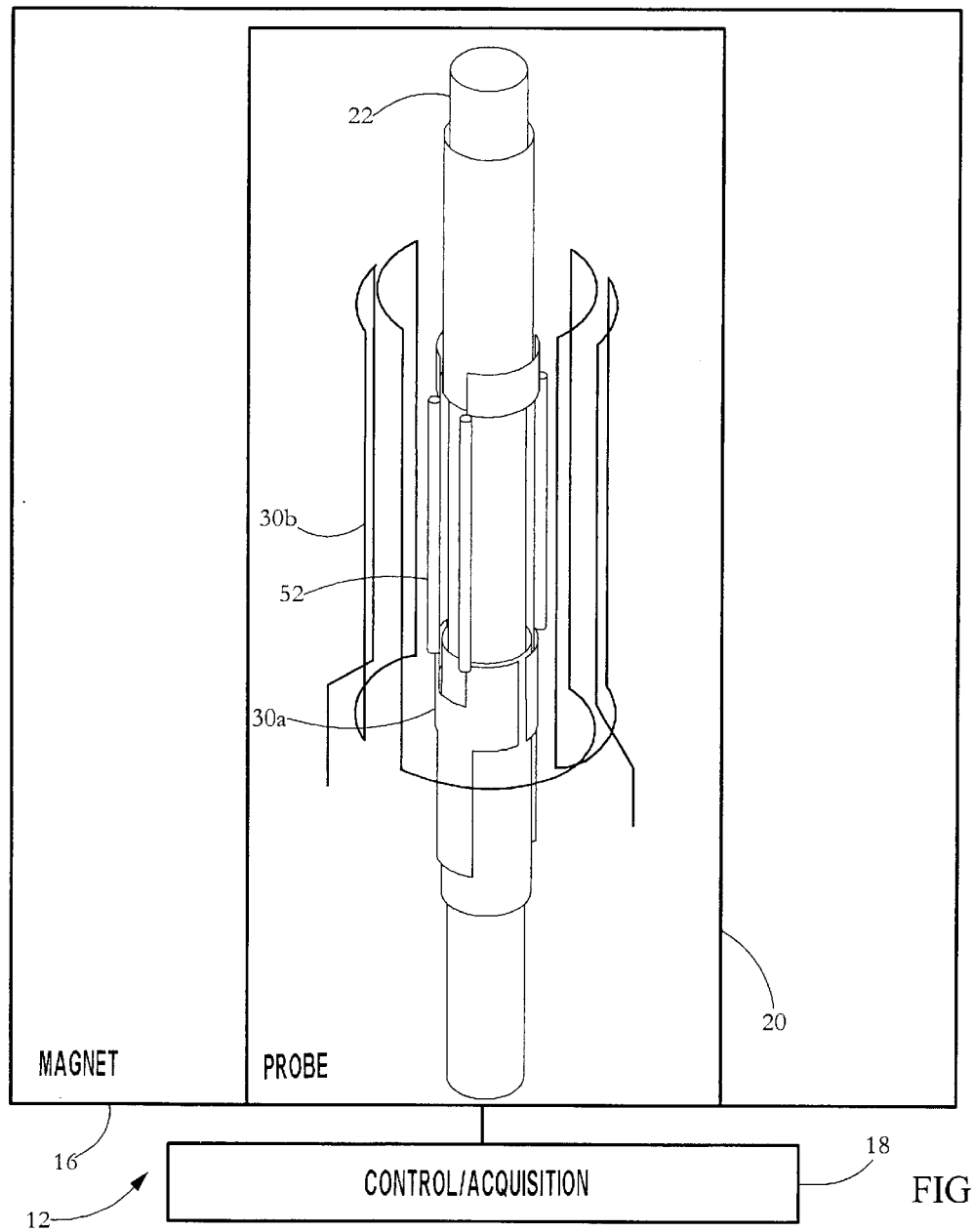
FIG. 1 is a schematic diagram of an NMR spectrometer according to the present invention.

FIG. 1 is a schematic diagram illustrating a nuclear magnetic resonance (NMR) spectrometer 12 according to the present invention. Spectrometer 12 comprises a magnet 16, an NMR probe 20 inserted in a bore of magnet 16, and a control/acquisition system 18 electrically connected to magnet 16 and probe 20. Probe 20 includes a conventional sample holder or sample holding components for holding one NMR sample of interest 22 at a time while measurements are performed on sample 22. Probe 20 can be a flow-through probe or a stationary-sample. In a flow-through probe, sample 22 is typically held in a flow cell. In a stationary-sample probe, sample 22 is typically held in a test tube.

Magnet 16 applies a static longitudinal magnetic field $B_0$ to the samples. Control/acquisition system 18 comprises electronic components for applying desired radio-frequency pulses to probe 20, and acquiring data indicative of the nuclear magnetic resonance properties of the samples within probe 20. Probe 20 includes a coil assembly having one or more radio-frequency (RF) coils (resonators) 30a–b for applying transverse radio-frequency magnetic fields $B_1$ to sample 22, and/or for measuring the response of sample 22 to the applied magnetic fields. The same coil can be used for both applying an RF magnetic field and for measuring the sample response to the applied magnetic field. Alternatively, one coil may be used for applying an RF magnetic field, and another coil for measuring the response of the sample to the applied magnetic field.

Each RF coil 30a–b is electromagnetically coupled to sample 22, and is electrically connected to control/acquisition system 18. RF coils 30a–b are preferably disposed concentrically relative to the longitudinal axis of probe 20. RF coils 30a–b are disposed mutually orthogonally, and generate mutually orthogonal transverse magnetic fields. Each RF coil 30a–b can be mounted on a support made of a material such as quartz or sapphire, chosen so as not to affect the NMR measurements of interest.

Each RF coil 30a–b can have a different resonant frequency. For example, one of coils 30a–b can be tuned to perform $^1H$ NMR measurements, while the other can be tuned to perform $^{13}C$ NMR measurements. Coils 30a–b can be used in general to perform NMR measurement on other nuclei of interest, such as $^{19}F$ and $^{31}P$ In a present implementation, an inner rounded-sheet coil 30a as described below is used to perform $^1H$ NMR measurements, while an outer orthogonal wire coil 30b is used to perform $^{13}C$ NMR measurements. In this implementation, outer wire coil 30b is a conventional saddle-shaped coil made of a susceptibility-compensated wire.

FIG. 2-A shows an isometric view of the conductive part of a rounded-sheet radio-frequency (RF) coil 30a according to the preferred embodiment of the present invention. The conductive part of coil 30a is mounted on a cylindrical dielectric support 60, illustrated in FIG. 2B. Referring back to FIG. 2-A, coil 30a includes an electrically-conductive central structure 32, and a pair of cylindrical conductive floating shields 34a–b disposed on opposite longitudinal sides of central structure 32. The central axis of each shield 34a–b is aligned with the longitudinal central axis of central structure 32. A measurement volume 36 is defined in the center of central structure 32, between shields 34a–b. The measurement volume 36 sequentially accommodates NMR samples of interest held in cylindrical sample tubes of flow cells. Shields 34a–b are capacitively coupled to central structure 32 along at least part of the surfaces of shields 34a–b adjacent to measurement volume 36. Shields 34a–b serve to reduce the parasitic excitation of the NMR samples due to RF pickup from coil leads or other conductive structures, and to shield the NMR samples from undesired external electric fields. Shields 34a–b also provide additional distributed capacitance to coil 30a.

Central structure 32 includes a pair of external longitudinal leads 38a–b extending longitudinally away from measurement volume 36, toward the distal end of shield 34a. Leads 38a–b provide an electrical connection to control/measurement electronics 18 (shown in FIG. 1). Central structure 32 further includes a pair of ring-shaped transverse conductors (rings) 40a–b, and a set of four rounded-edge longitudinal conductors 52a–d interconnecting rings 40a–b.

Rings 40a–b are disposed on opposite sides of measurement volume 36, and are disposed around the proximal ends of shields 34a–b. Ring 40a has a pair of longitudinal gaps 44a–b defined therethrough. Gaps 44a–b are situated on opposite sides of ring 40a. Gaps 44a–b extend along the entire longitudinal extent of ring 40a, so as to divide ring 40a into separate arcuate ring sections 46a–b. Gaps 44a–b prevent the flow of current through ring 40a around a complete circle. Ring 40b has a pair of longitudinal gaps 48a–b defined therethrough. Gaps 48a–b are situated on axially-opposite sides of ring 40b, substantially at 90° relative to gaps 44a–b. Gaps 48a–b extend along the entire longitudinal extent of ring 40b, so as to divide ring 40b into separate ring sections 50a–b. Gaps 48a–b prevent the flow of current through ring 40b around a complete circle.

A plurality of elongated, longitudinal curled-sheet conductive segments (rungs, conductors) 52a–d interconnect rings 40a–b. Longitudinal segments 52a–d extend along measurement volume 36 between rings 40a–b. Each longitudinal segment 52a–d is a tubular, preferably cylindrical, closed longitudinal conductor. Longitudinal segments 52a–b connect section 46a to sections 50a–b, respectively. Longitudinal segments 52c–d connect section 46b to sections 50a–b, respectively.

Preferably, longitudinal segments 52a–d are situated transversely outward relative to rings 40a–b, on the outside of rings 40a–b. Each segment 52a–d curls outward, and the sign of the curvature of each segment 52a–d is preferably opposite that of its corresponding ring section 46, 50. The curvature of the sheet forming segments 52a–d and rings 40a–b changes sign at the interfaces between segments 52a–d and rings 40a–b. Thus, coil 30a has two regions of different curvatures: a transverse conductor region defined by rings 40a–b having a relatively large radius of curvature, and a longitudinal conductor region defined by segments 52a–d having a smaller radius of curvature and an opposite curvature sign. Positioning segments 52a–d externally provides for relatively easy manufacture of the coil. Alternatively, longitudinal segments 52a–d may curl inward, and may be positioned on the internal side of rings 40a–b.

Rings 40a–b and segments 52a–d form two loops facing each other along a transverse (x- or y-) direction, for generating an RF magnetic field 54 along that direction. Current flows through the two loops in the same direction (clockwise or counterclockwise), such that the RF magnetic fields generated by the two loops reinforce each other. As an external voltage is applied over leads 38a–b, current flows from lead 38a through ring section 46a, longitudinal segments 52a–b, through ring sections 50a–b, longitudinal segments 52c–d, and ring section 46b to lead 38b. The current flow through coil 30a generates a transverse RF magnetic field illustrated in FIG. 2-A by the arrow 54.

Preferably, central structure 32, which includes rings 40a–b and longitudinal conductors 52a–d, is formed from a single susceptibility-compensated thin sheet. In a present implementation, central structure 32 and shields 34a–b are made of susceptibility-compensated palladium-plated copper about 0.002 inches thick. In general, other materials such as aluminum, platinum, copper and stacks of such materials are suitable for central structure 32 and shields 34a–b. For example, an Al—Cu susceptibility-compensated sandwich may be used. Other materials having susceptibilities of opposite signs may be used to yield a magnetic susceptibility for coil 30a equal to the magnetic susceptibility of air or vacuum.

In a present implementation, the overall transverse size of rings 40a–b and shields 34a–b is on the order of 1 cm, and the transverse size of each longitudinal conductor 52a–b is about 1 mm. For typical NMR applications, transverse coil sizes for coil 30a can range from a few millimeters to a few centimeters, and the transverse sizes of longitudinal conductors 52a–b can range from tenths of mm to a few mm. The longitudinal extents of longitudinal conductors 52a–b and rings 40a–b can be on order of a few cm.

The transverse size and radius of curvature of the tubular portion of each longitudinal conductor 52a–d is preferably much smaller (e.g. less than ⅕, or less than ¹⁄₁₀) than the transverse size and radius of curvature of rings 40a–b. At the same time, the radius of curvature of each longitudinal conductor 52a–d is larger than the thickness of the sheet forming the longitudinal conductor. Reducing the transverse size of longitudinal conductors 52a–d allows an improvement in the sensitivity of the external, orthogonal RF coil 30b, by reducing the extent to which longitudinal conductors 52a–d obstruct the magnetic field generated by the external coil. At the same time, excessively reducing the transverse size of the boundary features of longitudinal conductors 52a–d can lead to higher RF losses in longitudinal conductors 52a–d, due to the concentration of RF current at any sharp edges of longitudinal conductors 52a–d.

FIG. 2-B shows an isometric view of a dielectric coil support 60 suitable for supporting the conductive part of coil 30a. Support 60 is shaped as a hollow cylindrical shell, and has a longitudinal inner bore 66 for receiving the sample tubes or flow cells of interest. Inner bore 66 extends from the top end to the bottom end of support 60. Support 60 has a longitudinal outer surface 62, and a longitudinal inner surface 64. Shields 34a–b (shown in FIG. 2-A) are attached to and abut inner surface 64. Rings 40a–b and leads 38a–b (shown in FIG. 2-A) are attached to and abut outer surface 62. Support 60 is preferably made of a dielectric material that does not interfere with NMR measurements, such as quartz or sapphire. Support 60 is secured at its longitudinal ends to the structure of the probe containing coil 30a.

An alternative dielectric support for the conductive part of coil 30a may include a plurality of thin longitudinal rods, each extending through and abutting the interior of one of longitudinal conductors 52a–d. The rods may be support by transverse end structures attached to an inner cylindrical dielectric support such as the one shown in FIG. 2-B. Such rods may be useful for rolling longitudinal conductors 52a–d around the rods during the manufacture of coil 30a.

FIG. 3-A shows a schematic isometric view of the conductive part of a conventional multi-turn saddle-shaped RF coil 30b suitable for use in a coil assembly in conjunction with coil 30a. The conductor of FIG. 3-A can be a conventional susceptibility-compensated saddle-shaped wire. The direction of the transverse RF magnetic field generated by coil 30b is illustrated by the arrow 78. The magnetic field generated by coil 30b is orthogonal to the magnetic field generated by coil 30a.

FIG. 3-B shows an isometric view of a conventional coil support 82 suitable for supporting the conductor of coil 30b. Coil support 82 includes two parallel transverse mounting plates 86a–b, and a plurality of longitudinal rods 88 connecting mounting plates 86a–b. Mounting plates 86a–b have corresponding aligned central apertures defining an internal coil space 90 for receiving coil 30a and the sample of interest. Longitudinal rods 88 are arranged around the central apertures of mounting plates 86a–b. Each longitudinal conductor of the wire shown in FIG. 3-A is attached to one of the longitudinal rods 88 at one or more points. Mounting plates 86a–b are secured to the structure of the probe containing coil 30b.

FIGS. 4-A and 4-B show transverse sectional views of a coil assembly comprising an inner curled-sheet coil and an outer wire coil, and exemplary, synthetically-generated magnetic field lines illustrating the magnetic fields generated by the two coils. FIG. 4-A illustrates the magnetic field generated by the inner, curled-sheet coil, while FIG. 4-B illustrates the magnetic field generated by the outer, wire coil. The magnetic field lines correspond to a substantially central transverse plane passing through the measurement volume defined by the coil assembly. The magnetic field computation was performed for infinitely long longitudinal conductors arranged in the configuration shown in FIGS. 4-A and 4-B, with the assumption that the transverse coil size is much smaller than the wavelength of the RF field. For illustrative purposes, a frequency of 800 MHz corresponds to a wavelength of tens of centimeters, which is much larger than a typical transverse coil size on the order of 1 cm.

FIGS. 4-C and 4-D show transverse sectional views of a coil assembly comprising a prior art inner flat-sheet coil and a prior art outer wire coil. The inner coil is relatively flat, i.e. non-curled. The radius of curvature of the longitudinal conductors of the inner coil is equal to the overall transverse radius of the coil. FIG. 4-C illustrates the magnetic field generated by the inner flat-sheet coil, while FIG. 4-D illustrates the magnetic field generated by the outer wire coil. The illustrated magnetic field lines were computed using the infinite-conductor and small-coil-size assumptions described above for FIGS. 4-A and 4-B. The notation "Prior Art" in FIGS. 4-C and 4-D refers to the general coil configuration shown, rather than the particular magnetic field line computations illustrated in the figures.

As illustrated by FIG. 4-D, the relatively large surface area presented by the inner flat-sheet coil limits the penetration of the magnetic field generated by the outer wire coil into the measurement volume. Thus, the inner flat-sheet coil can significantly limit the sensitivity that can be achieved with the outer wire coil. Moreover, the relatively sharp edges of the inner flat-sheet coil lead to the concentration of current at those edges. The current concentration leads to higher RF losses, and thus reduced sensitivity, for the inner flat-sheet coil.

In the presently preferred embodiment, each longitudinal conductor 52a–d shown in FIG. 2-A is formed by at least part of a curled (rounded) sheet. As illustrated in FIGS. 4-A and 4-B, the external boundary of each segment 52a–d has a rounded shape. Preferably, the external boundary of segment 52a–d has a circular or quasi-circular shape, and does not include sharp edges. A quasi-circular shape can include a circle that is not completely closed, such as a circle having a gap.

Referring back to FIG. 2-A, providing rounded edges around the windows and slots of coil 30a around measurement volume 36 allows reducing the RF power dissipated by coil 30a, as well as improving the RF field homogeneity within measurement volume 36. In relatively flat sheets having sharp edges, the RF current tends to concentrate at the sheet edges. This current concentration leads to increased RF power losses for applied RF pulses, and to decreased measurement sensitivities. In rounded-edge coils, the RF current is relatively evenly distributed. The relatively even current distribution leads to decreased power losses and increased measurement sensitivities. The increased coil efficiency achieved by rounding the coil edges can be traded-off for increased field homogeneity if desired. For example, increasing the overall transverse size of coil 30a can lead to reduced sensitivity for coil 30a, but also to increased homogeneity in the magnetic fields corresponding to both coils 30a–b.

To make coil 30a, a suitable pattern is first cut by well-known methods into a flat sheet of a desired material or materials. The flat pattern is rolled around a glass or quartz tube to form the end rings 40a–b of coil 30a. The rolled coil now has a set of flat longitudinal sections or wings which are to be curled into longitudinal conductors 52a–d. The coil is inserted into a sheet-curling tool as described below, and the sheet-curling tool is used to curl each flat longitudinal section into a tubular conductor.

Figure 5:
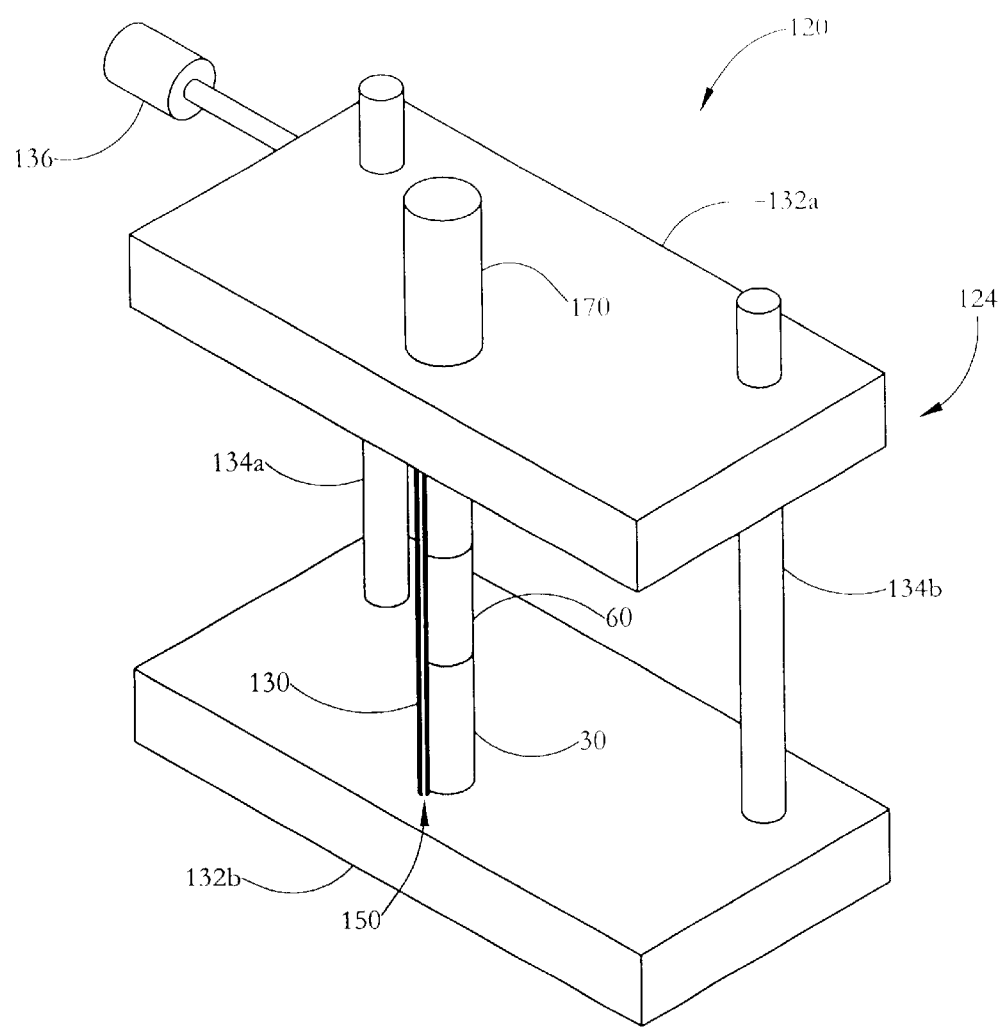
FIG. 5 shows an isometric view of a sheet-curling tool according to the present invention.

FIG. 5 shows an isometric view of a sheet-curling tool 20 according to the preferred embodiment of the present invention. Curling tool 120 comprises a support 124, and a longitudinal elongated curling member 130 mounted on support 124. Support 124 comprises two parallel, generally transverse plates 132a–b, two parallel longitudinal guides or rails 134a–b mounted on a lower plate 132b, and a height adjustment control 136 connected to an upper plate 132a. Two longitudinal apertures are defined through upper plate 132a. The apertures are sized to allow guides 134a–b to slide through upper plate 132a. Height adjustment control 136 is a screw capable of protruding through upper plate 132a and contacting guide 134a, thus locking upper plate 132a into place relative to lower plate 32b. Guides 134a–b are longer than the height of the coil to be manufactured.

Curling member 130 can be removably mounted through upper plate 132a. Curling member 130 is shaped as an elongated cylinder, and has a thin longitudinal slot 150 extending from the proximal (top) of end of curling member 130 to the open distal (bottom) end of curling member 130. The width of slot 150 is chosen such that the sheet to be curled fits tightly through slot 150. For example, in a present implementation in which the sheet to be curled has a thickness of 0.002 inch, the corresponding slot used for curling the sheet has a width of 0.004–0.005 inch. The diameter of curling member 30 is chosen to be equal to the desired diameter of the curled longitudinal coil conductors. A rotatable curling control or knob 170 is attached to curling member 30. Knob 170 is used to control the rotation of curling member 130 about its longitudinal axis.

To start the operation of sheet curling tool 120, control 136 is loosened and upper plate 132a is removed from guides 134a–b. Coil 30a is then positioned onto lower plate 132b, and upper plate 132a is lowered onto guides 134a–b. Coil 30a includes a sheet conductor rolled around a cylindrical glass support 60. The sheet conductor includes four flat longitudinal sections or wings extending from the rolled body. For clarity of presentation, the flat longitudinal sections are not shown in FIG. 5. When coil 30a is secured between plates 132a–b, control 136 is screwed into upper plate 132a to prevent the longitudinal motion of upper plate 132a relative to lower plate 132b.

Curling member 130 is then inserted through upper plate 132a, and one of the flat longitudinal sections of coil 30a is inserted into slot 150 as curling member 130 is lowered into place. Curling member 130 is then rotated about its longitudinal axis, and the flat section of coil 30a is curled around the curling member. The transverse rings of coil 30a may be allowed to rotate during the curling step. After the flat section has been curled into a tube, the two longitudinal sides of the tube can be secured together using a drop of solder of adhesive. Curling member 130 is then removed vertically from the tube, coil 30a is rotated to place another flat section in position for curling, and the above process is repeated.

FIG. 6 shows a schematic central transverse view of a rounded-sheet RF coil 230 according to an alternative embodiment of the present invention. Coil 230 includes four symmetrically disposed longitudinal conductors 252. Conductors 252 are part of a larger sheet including transverse rings as shown in FIG. 2-A. Referring back to FIG. 6, each conductor 252 includes a rounded, tubular portion 260 and an adjacent generally flat portion (strip) 262. The direction of the RF magnetic field generated by coil 230 is illustrated by the arrow 254. The rounded edges provided by tubular portions 260 allow reduced coil losses in coil 230. The strips 262 do not substantially obstruct the magnetic field produced by coil 230. A coil having flat portions can be particularly suited for use in a probe which does not include another orthogonal coil, whose magnetic field would be otherwise obstructed by the flat portions.

FIG. 7 shows a schematic central transverse view of a rounded-sheet RF coil 330 according to another alternative embodiment of the present invention. Coil 330 includes four symmetrically disposed longitudinal conductors 352. Conductors 352 are part of a larger sheet including transverse rings as shown in FIG. 2-A. Referring back to FIG. 7, each conductor 352 includes a curled portion 370 and an adjacent flat portion (strip) 372. The direction of the RF magnetic field generated by coil 330 is illustrated by the arrow 354. Curled portion 370 is curled for over 180°, to allow removing the longitudinal edges of coil 330 from the high-magnetic-field regions at the frontal windows of coil 370 to the lower-magnetic-field regions on the sides of coil 330.

A coil of the present invention need not have exactly four longitudinal conductors. Higher or lower numbers of longitudinal conductors may be used, depending on the particular desired coil shape and number of coil turns. Furthermore, curled-sheet longitudinal conductors may be replaced by solid-wire longitudinal conductors having rounded cross-sections. Susceptibility-compensated wires formed from multiple concentric materials having different susceptibilities are known in the art. Such wire conductors can be attached to sheet transverse rings such as the rings shown in FIG. 2-A. The flat, sheet-shaped transverse conductors provide relatively high distributed capacitances, while the rounded wire longitudinal conductors allow reducing the sharp-edge perimeter of the coil and increasing the transparency of the coil to orthogonal fields. At the same time, the attachment interfaces between the wire conductors and the sheet rings can lead to additional RF losses in the coil. Moreover, coils requiring the attachment of wire conductors to sheet rings can be more difficult to manufacture than the coil configuration illustrated in FIG. 2-A.

FIGS. 8-A through 8-C show central transverse views of three rounded-conductor RF coils 430a–c according to the present invention. Coils 430a–c include sets of plural longitudinal solid-wire conductors 452a–c, respectively. Longitudinal conductors 452a–c are attached at their ends to transverse sheet conductors such as the ones illustrated in FIG. 2-A. Referring back to FIGS. 8-A through 8-C, the directions of the magnetic fields generated by coils 430a–c are illustrated by arrows 454a–c, respectively. Higher numbers of rounded longitudinal conductors may be employed if desired for a particular coil design.

FIG. 9 shows an isometric view of the conductive part of a curled-sheet birdcage RF coil 530 according to the present invention. Coil 530 includes a conductive central structure 532, and a pair of shields 534 capacitively coupled to central structure 532. Central structure 532 includes a pair of slotted transverse conductive rings 540a–b, and a plurality of curled-sheet longitudinal conductors 552 interconnecting rings 540a–b, and two pairs of oppositely-spaced conductive leads 538 connected to ring 540b.

Central structure 532 is formed by four distinct conductors mounted every 90° around a circle. Ring 540a comprises four distinct conductive sections 556 separated by four longitudinal slots. Similarly, ring 540b comprises four distinct conductive sections 558 separated by longitudinal slots. Each section 556 is connected to a corresponding aligned section 558 by a longitudinal conductor 552. Each conductive lead 538 is connected to a corresponding section 558. Coil 530 is driven through leads 538. The two pair of oppositely-spaced leads 538 may be driven with relative phase shift in the applied driving current. As is apparent to the skilled artisan, in practice a birdcage coil may include more than four sections.

It will be clear to one skilled in the art that the above embodiments may be altered in many ways without departing from the scope of the invention. RF coils having rounded conductors can be useful for magnetic resonance applications such as magnetic resonance imaging (MRI), where the target of interest can be tissue or part of a living human. Suitable transverse shapes for the outer boundary of the longitudinal segments of a coil of the present invention include ellipsoidal or quasi-ellipsoidal shapes. The internal cross-section of the longitudinal conductors need not be critical. A rounded-conductor coil of the present invention can be used in conjunction with a conventional orthogonal wire or sheet coil, or with another orthogonal rounded-conductor sheet coil. The orthogonal coil can be placed on the outside or on the inside of the rounded-conductor coil. The transverse edges of the transverse ring-shaped conductors adjacent to the measurement volume can also be curled inward or outward. The measurement volume can be then bounded by conductive toroids with circular longitudinal cross-sections. Accordingly, the scope of the invention should be determined by the following claims and their legal equivalents.

What is claimed is:

1. A nuclear magnetic resonance coil assembly for a nuclear magnetic resonance probe, comprising:
    a) a first transverse-field radio-frequency coil, comprising
        a pair of longitudinally-spaced, generally transverse conductive sheet rings, and
        a plurality of curled-sheet longitudinal conductors electrically interconnecting the rings, each of the longitudinal conductors having a first end connected to a first ring of the pair of rings and a second end connected to a second ring of the pair of rings, each of the longitudinal conductors comprising a generally longitudinal part curled about a longitudinal axis; and
    b) a second transverse-field radio-frequency coil positioned substantially orthogonally and concentrically relative to the first coil, the second coil being distinct from the first coil.

2. The coil assembly of claim 1, wherein each of the longitudinal conductors has a substantially circular transverse cross-section.

3. The coil assembly of claim 1, wherein each of the longitudinal conductors has a substantially closed transverse cross-section.

4. The coil assembly of claim 1, wherein each of the longitudinal conductors is curled outward relative to the conductive sheet rings.

5. The coil assembly of claim 1, wherein the first coil is laterally enclosed by the second coil.

6. The coil assembly of claim 1, wherein the second coil is laterally enclosed by the first coil.

7. The coil assembly of claim 1, wherein the conductive sheet rings and the longitudinal conductors are formed from a single conductive sheet.

8. The coil assembly of claim 7, wherein the single conductive sheet is susceptibility-compensated.

9. The coil assembly of claim 1, wherein each of the longitudinal conductors and each of the conductive sheet rings is susceptibility-compensated.

10. The coil assembly of claim 1, wherein the transverse size of each of the longitudinal conductors is at least a factor of five smaller than the transverse size of each of the conductive sheet rings.

11. The coil assembly of claim 1, wherein the first coil further comprises a longitudinal cylindrical dielectric support, wherein the conductive sheet rings are mounted on the dielectric support.

12. The coil assembly of claim 1, wherein the first coil further comprises a plurality of longitudinal dielectric support rods, each longitudinal conductor being curled around and adjacent to one of the longitudinal dielectric rods.

13. The coil assembly of claim 1, wherein the first coil further comprises a pair of sample shields positioned internally relative to the conductive sheet rings, situated on opposite longitudinal sides of the longitudinal conductors and extending away from the longitudinal conductors.

14. The coil assembly of claim 1, wherein the first coil is a saddle-shaped coil, each of the rings being slotted.

15. The coil assembly of claim 1, wherein the first coil is a birdcage coil, each of the rings being continuous.

16. A radio-frequency coil for a nuclear magnetic resonance probe, comprising:
    a) a pair of longitudinally-spaced, generally transverse conductive sheet rings; and
    b) a plurality of curled-sheet longitudinal conductors electrically interconnecting the rings, each of the longitudinal conductors being formed by a substantially longitudinal tube, each of the longitudinal conductors having a first end connected to a first ring of the pair of rings and a second end connected to a second ring of the pair of rings.

17. The coil of claim 16, wherein each of the longitudinal conductors has a substantially circular transverse cross-section.

18. The coil of claim 16, wherein each of the longitudinal conductors has a substantially closed transverse cross-section.

19. The coil of claim 16, wherein each of the longitudinal conductors is curled outward relative to the conductive sheet rings.

20. The coil of claim 16, wherein the conductive sheet rings and the longitudinal conductors are formed from a single conductive sheet.

21. A radio-frequency coil for performing nuclear magnetic resonance measurements, comprising:
    a) a plurality of generally longitudinal conductors, each comprising a curled sheet comprising a generally longitudinal, substantially tubular portion curled about a longitudinal axis; and
    a pair of longitudinally spaced, generally transverse sheet conductors interconnecting the longitudinal conductors, each of the longitudinal conductors having a first end connected to a first transverse conductor of the pair of transverse conductors and a second end connected to a second transverse conductor of the pair of transverse conductors.

22. The coil of claim 21, wherein each of the longitudinal conductors has a substantially circular transverse cross-section.

23. The coil of claim 21, wherein each of the longitudinal conductors has a substantially closed transverse cross-section.

24. The coil of claim 21, wherein each of the longitudinal conductors is curled outward relative to the transverse sheet conductors.

25. The coil of claim 21, wherein the transverse sheet conductors and the longitudinal conductors are formed from a single conductive sheet.

26. A radio-frequency coil for performing nuclear magnetic resonance measurements, comprising:
    a) a plurality of generally longitudinal conductors, each comprising a longitudinal, substantially tubular-shaped portion; and
    b) a pair of longitudinally spaced, generally transverse sheet conductors interconnecting the longitudinal conductors such that each of the longitudinal conductors has a first end connected to a first sheet conductor of the pair of sheet conductors and a second end connected to a second sheet conductor of the pair of sheet conductors.

27. The coil of claim 26, wherein said each longitudinal conductor consists of the tubular-shaped portion.

28. The coil of claim 26, wherein the tubular-shaped portion is formed by a solid wire.

29. The coil of claim 28, wherein the wire is susceptibility compensated.

30. The coil of claim 26, wherein the tubular-shaped portion is formed by a transversely-curled sheet.

31. The coil of claim 30, wherein said each longitudinal conductor further comprises an uncurled longitudinal strip connected to the tubular portion.

32. The coil of claim 26, wherein the tubular portion has a circular transverse cross-section.

33. The coil of claim 26, wherein the tubular-shaped portion is situated transversely outward relative to the transverse sheet conductors.

34. A saddle-shaped radio-frequency coil for performing nuclear magnetic resonance measurements on a sample, comprising;
 a) two pairs of parallel, generally longitudinal conductors, each comprising a curled susceptibility-compensated sheet comprising a generally longitudinal, substantially cylindrical portion;
 b) a first generally transverse, arcuate susceptibility-compensated sheet conductor having two separate first sections separated by a first pair of longitudinal gaps, each first section electrically interconnecting one pair of longitudinal conductors; and
 c) a second generally transverse, arcuate susceptibility-compensated sheet conductor having two separate second sections separated by a second pair of longitudinal gaps, the second sheet conductor being situated longitudinally opposite the first sheet conductor relative to the longitudinal conductors, each second section interconnecting a longitudinal conductor from one of the pairs of longitudinal conductors to a longitudinal conductor from another of the pairs of longitudinal conductors, wherein each of the longitudinal conductors has a first end connected to the first sheet conductor and a second end connected to the second sheet conductor.

35. The coil of claim 34, further comprising a pair of cylindrical sample shields, each sample shield being positioned internally and concentrically relative to one of the arcuate sheet conductors, the sample shields being disposed on opposite longitudinal sides of the longitudinal conductors and extending away from the longitudinal conductors.

36. The coil of claim 35, further comprising a cylindrical, generally-longitudinal dielectric support for supporting the coil, the support having an inner longitudinal surface and an outer longitudinal surface, the sample shields being mounted on the inner surface, the first sheet conductor and the second sheet conductor being mounted on the outer surface.

37. A nuclear magnetic resonance probe for performing nuclear magnetic resonance measurements on a sample, comprising:
 a) a sample holder for positioning the sample in a static magnetic field within a sample measurement volume; and
 b) a first transverse-field radio-frequency coil mechanically coupled to the sample holder, comprising:
  a plurality of generally longitudinal conductors, each comprising a longitudinal, substantially tubular-shaped portion extending along the sample measurement volume, and
  a pair of generally transverse sheet conductors interconnecting the longitudinal conductors, and positioned on opposite longitudinal sides of the sample measurement volume, wherein each of the longitudinal conductors has a first end connected to a first sheet conductor of the pair of sheet conductors and a second end connected to a second sheet conductor of the pair of sheet conductors.

38. The probe of claim 37, further comprising a second transverse-field radio-frequency coil mechanically coupled to the sample holder, positioned substantially orthogonally and concentrically relative to the first coil.

39. A nuclear magnetic resonance spectrometer for performing nuclear magnetic resonance measurements on a sample, comprising:
 a) a magnet for generating a static magnetic field; and
 b) a nuclear magnetic resonance probe positioned within a bore of the magnet, comprising
  a sample holder for positioning the sample in the static magnetic field within a sample measurement volume; and
  a first transverse-field radio-frequency coil mechanically coupled to the sample holder, comprising:
   a plurality of generally longitudinal conductors, each comprising a longitudinal, substantially tubular-shaped portion extending along the sample measurement volume, and
   a pair of generally transverse sheet conductors interconnecting the longitudinal conductors, and positioned on opposite longitudinal sides of the sample measurement volume, wherein each of the longitudinal conductors has a first end connected to a first sheet conductor of the pair of sheet conductors and a second end connected to a second sheet conductor of the pair of sheet conductors.

40. The spectrometer of claim 39, further comprising a second transverse-field radio-frequency coil mechanically coupled to the sample holder, positioned substantially orthogonally and concentrically relative to the first coil.

41. A nuclear magnetic resonance measurement method comprising the steps of:
 a) positioning a sample within a sample measurement volume defined within a nuclear magnetic resonance probe, the probe including a radio-frequency coil comprising:
  a plurality of generally longitudinal conductors, each comprising a longitudinal, substantially tubular-shaped portion extending along the sample measurement volume, and
  a pair of generally transverse sheet conductors interconnecting the longitudinal conductors and positioned on opposite longitudinal sides of the sample measurement volume, wherein each of the longitudinal conductors has a first end connected to a first sheet conductor of the pair of sheet conductors and a second end connected to a second sheet conductor of the pair of sheet conductors;
 b) positioning the nuclear magnetic resonance probe within a bore of a magnet of a nuclear magnetic resonance spectrometer; and
 c) employing the magnet and the radio-frequency coil to perform a nuclear magnetic resonance measurement on the sample.

* * * * *

UNITED STATES PATENT AND TRADEMARK OFFICE
CERTIFICATE OF CORRECTION

PATENT NO.    : 6,593,743 B2
DATED         : July 15, 2003
INVENTOR(S)   : Thomas de Swiet It is certified that error appears in the above-identified patent and that said Letters Patent is hereby corrected as shown below:

<u>Title page,</u>
Item [75], Inventors, please delete "Marco A. Romo, Castro Valley, CA (US);"; and please delete "Nancy Winward, Milpitas, CA (US)".

Signed and Sealed this

Fourteenth Day of October, 2003

JAMES E. ROGAN
*Director of the United States Patent and Trademark Office*